United States Patent
Handa et al.

(10) Patent No.: US 6,821,830 B2
(45) Date of Patent: Nov. 23, 2004

(54) METHOD FOR FABRICATING A SEMICONDUCTOR DEVICE INCLUDING USING A HARD MASK OR A SILYLATED PHOTORESIST FOR AN ANGLED TILTED ION IMPLANT

(75) Inventors: Takato Handa, Shiga (JP); Hiroyuki Umimoto, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/647,284

(22) Filed: Aug. 26, 2003

(65) Prior Publication Data

US 2004/0087095 A1 May 6, 2004

(30) Foreign Application Priority Data

Oct. 8, 2002 (JP) ........................ 2002-294906

(51) Int. Cl.[7] .................. H01L 21/338; H01L 21/336; H01L 21/425
(52) U.S. Cl. ................ 438/184; 438/185; 438/302; 438/525
(58) Field of Search ................ 438/184, 185, 438/302, 525

(56) References Cited

U.S. PATENT DOCUMENTS 5,518,941 A * 5/1996 Lin et al. ............... 438/291
6,624,035 B1 * 9/2003 Luning et al. .......... 438/302
6,747,326 B2 * 6/2004 Tran ...................... 257/408

FOREIGN PATENT DOCUMENTS

| JP | 5-182904 | 7/1993 |
| JP | 5-303210 | 11/1993 |
| JP | 6-295875 | 10/1994 |
| JP | 7-58055 | 3/1995 |
| JP | 8-202050 | 8/1996 |

* cited by examiner

Primary Examiner—William M. Brewster
(74) Attorney, Agent, or Firm—McDermott Will & Emery LLP

(57) ABSTRACT

A hard mask 21a which has an opening for exposing a p-type region 2 defined in a silicon substrate 1 and is made of, for example, a BPSG film is formed. Then, the hard mask 21a is subjected to isotropic etching using argon gas, to have its edge rounded off, thereby forming an implantation hard mask 21 having a tapered edge. Subsequently, large-angle-tilt ion implantation of an n-type impurity is performed using the implantation hard mask 21 as a mask, thereby forming an n⁻ layer 13 having an LDD structure. Thereafter, the implantation hard mask 11 is removed. In this manner, it is possible to perform large-angle-tilt ion implantation using an implantation mask thinner than a conventional implantation mask.

9 Claims, 8 Drawing Sheets

METHOD FOR FABRICATING A SEMICONDUCTOR DEVICE INCLUDING USING A HARD MASK OR A SILYLATED PHOTORESIST FOR AN ANGLED TILTED ION IMPLANT

BACKGROUND OF THE INVENTION

The present invention relates to methods for fabricating semiconductor devices including processes of implanting ions into semiconductor layers at tilt angles.

As a method for forming a doped layer in a semiconductor layer, a technique of implanting ions into the semiconductor layer at a tilt angle of about 40 degrees with respect to the normal to the upper surface of the semiconductor layer (hereinafter referred to as large-angle-tilt ion implantation) has been known to date. The large-angle-tilt ion implantation is used in, for example, a process for fabricating a transistor having a lightly doped drain (LDD) structure. In this process, the large-angle-tilt ion implantation performed on a semiconductor layer on which a gate electrode has been formed allows the formation of a shallow n+layer extending to a region of the semiconductor layer under the gate electrode. This is disclosed in, for example, Japanese Laid-Open Publication No. 6295875 (pp. 3–5, FIG. 1)

Hereinafter, a known large-angel-tilt ion implantation technique will be described with reference to FIG. 9. FIG. 9 is a cross-sectional view showing a known process step of performing large-angle-tilt ion implantation in a process for fabricating a semiconductor device.

The semiconductor device shown in FIG. 9 includes, in an upper part of a silicon substrate 101, a p-type region 102, an n-type region 103 located at a side of the p-type region 102 and an insulating film 104 for transistor isolation provided between the P-type region 102 and the n-type region 103. The upper surface of the n-type region 103 is covered with a photoresist layer 114 with a thickness of 1.0 μm. The upper surface of the p-type region 102 is exposed with a gate insulating film 105 and a gate electrode 106 formed thereon.

In this state, ions of an n-type impurity are implanted into the p-type region 102 using the gate electrode 106 and the photoresist layer 114 as a mask, thereby forming an n⁻layer 115 having an LDD structure. These ions are implanted with the silicon substrate 101 rotated. In this case, the ion implantation is performed with tilt, so that an n⁻ layer 115 is formed to overlap with the gate electrode 106 in part of the p-type region 102 located under the edge of the gate electrode 106.

However, with the downsizing of the semiconductor device, the gate electrode 106 and the photoresist layer 114 come closer to each other, thus arising the following problems.

In the process step shown in FIG. 9, the ions are implanted at a tile angle 9: with respect to the vertical direction (the normal) to the upper surface of the silicon substrate 101. In this process step, if the thickness of the photoresist 114 formed on the n-type region 103 is large, emission of the ions with tilt is blocked partly by the photoresist 114. As a result, the impurity also cannot be implanted into part of a region to be the n⁻layer 115.

In particular, if the direction of the ion implantation is greatly tiled with respect to the normal to the substrate, ions are less implanted into part of the p-type region 102 under the gate electrode 106. As a result, an overlap between the gate electrode 160 and the n⁻layer 115 is less likely to be formed.

However, if the thickness of the photoresist layer 114 is reduced to implant the impurity into a region to be the n⁻layer 115, the impurity might penetrate through the photoresist layer 114 to reach the n-type region 103 and other regions.

SUMMARY OF THE INVENTION

It is therefore an object of the present invention to provide a method for fabricating a semiconductor device capable of being further reduced in size.

Specifically, a first inventive method for fabricating a semiconductor device includes the steps of: a) forming a gate insulating film and a gate electrode over a first transistor region defined in a semiconductor substrate; b) forming, on the semiconductor substrate, a hard mask having an opening for exposing the first transistor region therein, after the step a) has been performed; c) implanting an impurity into the semiconductor substrate in the manner of large-angle-tilt ion implantation, using the gate electrode and the hard mask as a mask for ion implantation; and d) removing the hard mask, after the step c) has been performed.

With this method, a hard mask having a high ability of preventing impurity implantation is used as a mask for ion implantation, so that the mask for ion implantation can be made thin. Accordingly, the direction of ion implantation can be set closer to the horizontal direction, resulting in that ions can be implanted into a wider region with a shallower junction depth.

In the step b), the thickness of the hard mask and the width of the opening of the hard mask are preferably defined such that the impurity reaches a region under the gate electrode during the large-angle-tilt ion implantation in the step c).

In part of the semiconductor substrate, a second transistor region may be provided at a side of the first transistor region with an insulating film for transistor isolation interposed therebetween, and in the step b), the hard mask may be formed to cover the second transistor region.

The hard mask is preferably one out of a BPSG film, a PSG film and a silicon nitride film.

The first inventive method preferably further includes the step e) of rounding off an upper edge of the hard mask, thereby making the hard mask to have a tapered edge, between the steps b) and c). Then, ions can be implanted into a wider region.

In the step e), isotropic etching may be performed, thereby making the hard mask to have the tapered edge In the step e), heat treatment may be performed, thereby making the hard mask to have the tapered edge.

A second inventive method for fabricating a semiconductor device includes the steps of: a) forming a gate insulating film and a gate electrode over a first transistor region defined in a semiconductor substrate; b) forming a resist layer on the semiconductor substrate; c) silylating at least part of the resist layer other than a region of the resist layer located on the first transistor region, thereby forming a silylated region; d) removing at least part of the region of the resist layer other than the silylated region, thereby forming a silylated resist pattern; and e) implanting an impurity into the semiconductor substrate in the manner of large-angle-tilt ion implantation, using the silylated resist pattern as a mask for ion implantation.

With this method, a silylated region having a high ability of preventing impurity implantation is used as a mask for ion implantation, so that the mask for ion implantation can be made thin. Accordingly, the direction of ion implantation can be set closer to the horizontal direction, resulting in that ions can be implanted into a wider region with a shallower junction depth.

The second inventive method preferably further includes the step of oxidizing the silylated region, between the steps d) and e). Then, the silylated layer has a higher ability of preventing ion implantation. As a result, the thickness of the mask for ion implantation

DESCRIPTION OF THE PREFERRED EMBODIMENTS

Embodiment 1

In a first embodiment of the present invention, the case of using not a resist layer but a boron-phospho-silicate glass (BPSG) film as a mask for ion implantation is described.

Figure 1A:
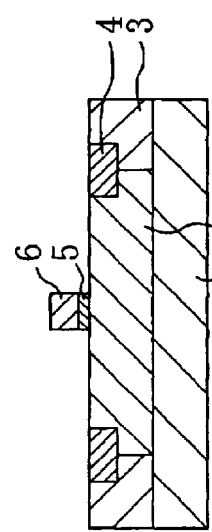
FIGS. 1A through 1F are cross-sectional views showing process steps up to a process step of forming an n⁻layer having an LDD structure in a process for fabricating a semiconductor device according to a first embodiment of the present invention.

FIGS. 1A through 1F are cross-sectional views showing process steps up to a process step of forming an n⁻layer having an LDD structure in a process for fabricating a semiconductor device according to the first embodiment First, in a process step shown in FIG. 1A, a p-type region 2 with a width of 0.5 $\mu$m, an n-type region 3 located at a side of the p-type region 2 and an insulating film 4 for transistor isolation interposed between the p-type region 2 and the n-type region 3 are defined in an upper part of a silicon substrate 1.

Thereafter, a gate insulating film 5 with a thickness of 5 nm is formed by a thermal oxidation process on the p-type region 2 defined in the silicon substrate 1. Then, a polysilicon film (not shown) is deposited by a CVD process on the gate insulating film 5, and then a resist film (not shown) is formed by a spin coating process on the polysilicon film. Subsequently, alignment is performed on the resist film, and then exposure and development are performed, thereby forming a resist pattern.

Then, the polysilicon film is subjected to reactive ion etching (RIE) using the resist pattern as a mask, thereby forming a gate electrode 6 with a gate length of 0.15 $\mu$m and a thickness of 0.2 $\mu$m. Thereafter, the resist pattern is removed.

Figure 1B:
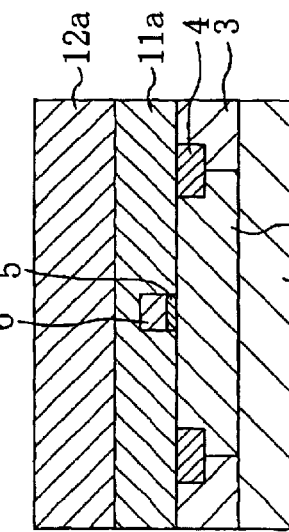

Next, in a process step shown in FIG. 1B, a BPSG film 11a is formed by a CVD process, for example, to a thickness of 0.6 sun over the substrate to cover the gate electrode 6. Then, the BPSG film 11a is polished by CMP, and then a resist film 12a is formed by a spin coating process on the BPSG film 1a.

Figure 1C:
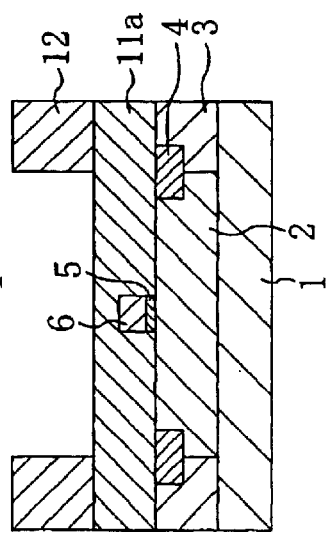

Then, in a process step shown in FIG. 1C, the resist film 12a is aligned, and exposure and development are performed, thereby forming a resist pattern 12 on the BPSG film 1a. The resist pattern 12 has an opening over the p-type region 2 and covers the n-type region 3 and part of the insulating film 4.

Figure 1D:
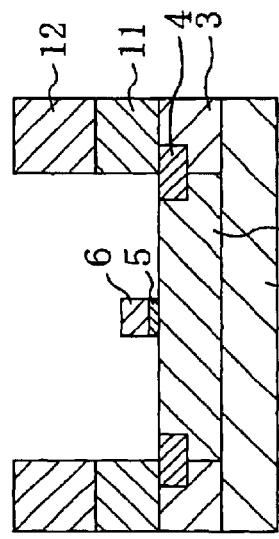

Thereafter, in a process step shown in FIG. 1D, RIE is performed with the resist pattern 12 used as a mask so that the BPSG film 11a is patterned, thereby forming an implantation hard mask 11 having an opening on the p-type region 2.

Figure 1E:
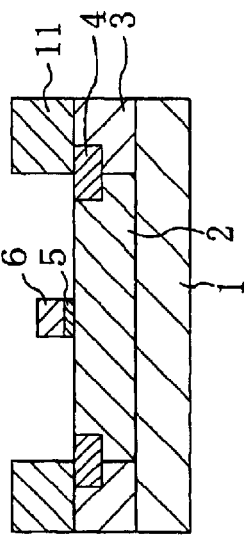

Then, in a process step shown in FIG. 1E, the resist pattern 12 is removed so that the upper surface of the implantation hard mask 11 is exposed.

Figure 1F:
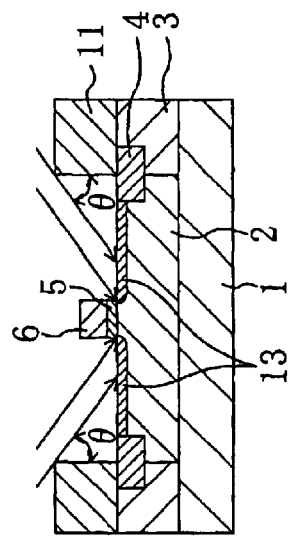

Subsequently, in a process step shown in FIG. 1F, large-angle-tilt ion implantation of an n-type impurity is performed at an implantation angle of 20 to 60 degrees with respect to the normal to the surface of the substrate, using the implantation hard mask 11 as a mask, thereby forming an n⁻layer 13 to a depth of 0.1 $\mu$m at an impurity concentration of $1 \times 10^{18}$/cm³. This large-angle-tilt ion implantation is performed with the silicon substrate 1 tilted and rotated. Thereafter, an n⁺ layer (not shown) having an impurity concentration higher than the n⁻layer 13 is formed in a well known manner, thus forming a transistor having an LDD structure. Then, selective etching is performed, thereby removing the implantation hard mask 11.

Figure 2:
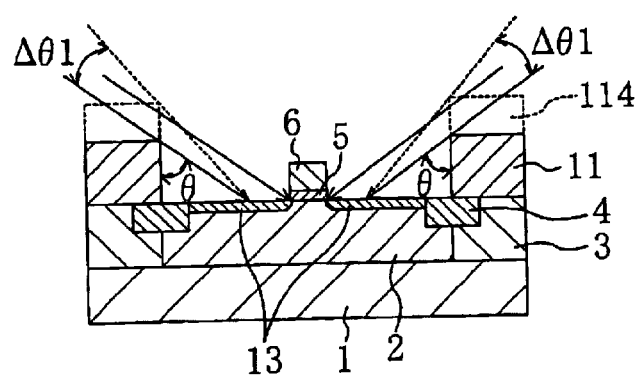
FIG. 2 is a cross-sectional view for describing an ion implantation technique for forming an n⁻layer 13 in the first embodiment, for comparison to a known ion implantation technique.

Now, advantages obtained in this embodiment are described with reference to FIG. 2. FIG. 2 is a cross-sectional view for describing an ion implantation technique for forming the n⁻layer 13 for comparison to the known ion implantation technique.

As shown in FIG. 2, as compared to the conventional photoresist 114, the implantation hard mask 11 of this embodiment can be made thin, so that the aspect ratio can be reduced. This is because the implantation hard mask 11 of this embodiment has a higher ability of preventing impurity implantation into the substrate than the conventional photoresist layer 114.

In this manner, the direction of ion implantation in this embodiment can be set closer to the horizontal direction than in the known ion implantation technique by an angle of Δθ1. As a result, ions can be implanted into a wider region with a shallower junction depth according to this embodiment. In addition, the impurity can be implanted into part of the p-type region 2 located under the gate electrode 6 with higher accuracy.

Embodiment 2

In a second embodiment of the present invention, the case where a BPSG film whose edge is rounded off by etching is used as a mask for ion implantation is described.

Figure 3A:
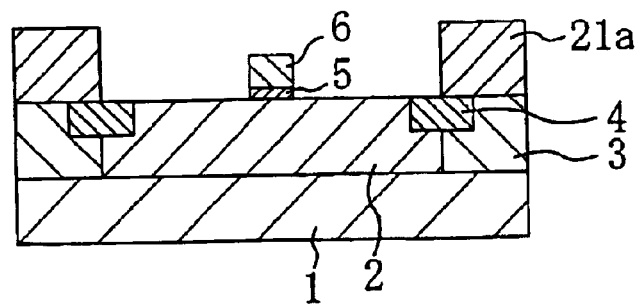
FIGS. 3A through 3C are cross-sectional views showing process steps up to a process step of forming an n⁻layer having an LDD structure in a process for fabricating a semiconductor device according to a second embodiment of the present invention.
Figure 3B:
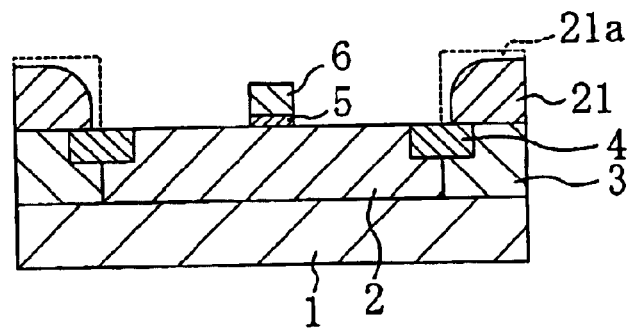
Figure 3C:
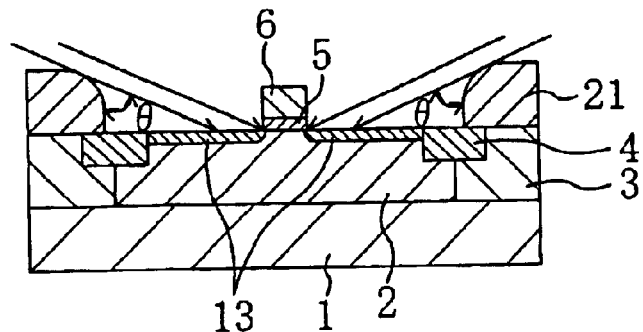

FIGS. 3A through 3C are cross-sectional views showing process steps up to a process step of forming an n⁻layer having an LDD structure in a process for fabricating a semiconductor device according to the second embodiment.

First, in a process step shown in FIG. 3A, a p-type region 2 with a width of 0.5 µm an n-type region 3 and an insulating film 4 for transistor isolation are defined in an upper part of a silicon substrate 1 in the same manner as in the first embodiment. Then, a gate insulating film 5 with a thickness of 5 nm and a gate electrode 6 with a gate length of 0.15 µm and a thickness of 0.2 µm are formed over the p-type region 2. Thereafter, a hard mask 21a having an opening on the p-type region 2 defined in the silicon substrate 1 is formed to cover the n-type region 3 and part of the insulating film 4. In this embodiment, the hard mask 21a has the same pattern as in the first embodiment.

Next, in a process step shown in FIG. 3B, isotropic etching is performed using argon gas. This etching proceeds isotropically in an upper surface and a side surface of the hard mask 21a. At this time, the edge of the hard mask 21a is etched in the direction of the normal to the substrate and in the horizontal direction, so that the etching rate at the edge is higher than the other portions. Accordingly, the edge of the hard mask 21a is rounded off by the isotropic etching, thereby forming an implantation hard mask 21 with a thickness of 0.6 µm having a tapered edge, out of the hard mask 21a.

Then, in a process step shown in FIG. 3C, large-angle-tilt ion implantation of an n-type impurity is performed using the implantation hard mask 21 as a mask, thereby forming an n⁻ layer 13 to a depth of 0.1 µm at an impurity concentration of $1 \times 10^{18}/cm^3$. This large-angle-tilt implantation is performed with the silicon substrate 1 tilted and rotated. Thereafter, an n⁺ layer (not shown) having an impurity concentration higher than the n⁻ layer 13 is formed in a well known manner and is subjected to selective etching, thereby removing the implantation hard mask 21. In this manner, a transistor having an LDD structure is formed.

Figure 4:
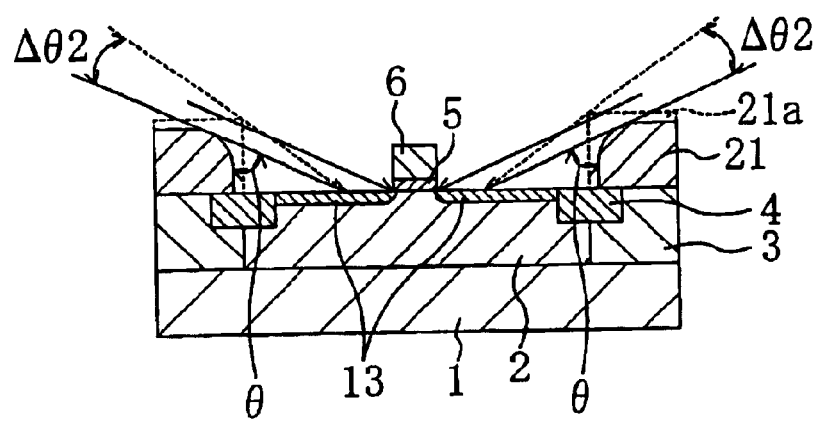
FIG. 4 is a cross-sectional view for describing an ion implantation technique for forming an n⁻layer 13 in the second embodiment, for comparison to the ion implantation technique in the first embodiment.

Now, advantages obtained in this embodiment are described with reference to FIG. 4. FIG. 4 is a cross-sectional view for describing an ion implantation technique for forming the n⁻ layer 13 for comparison to the ion implantation technique in the first embodiment.

In this embodiment, a BPSG film is used as the implantation hard mask 21. Accordingly, as in the first embodiment, the implantation mask can be made thinner than in the known technique, so that the aspect ratio can be reduced.

In addition, as shown in FIG. 4, the edge of the implantation hard mask 21 is isotropically etched to be rounded off, so that the direction of ion implantation can be made closer to the horizontal direction than in the first embodiment by an angle of Δθ2. As a result, ions can be implanted into a wider region.

Embodiment 3

In a third embodiment of the present invention, the case where a BPSG film whose edge is rounded off by heat treatment is used as a mask for ion implantation.

Figure 5A:
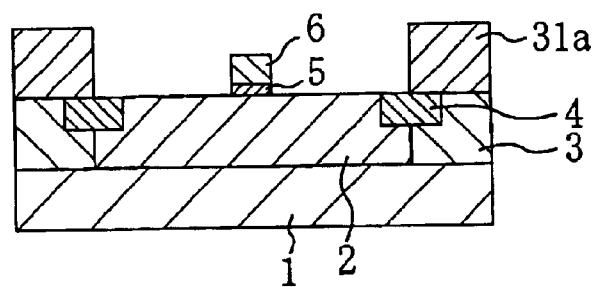
FIGS. 5A through 5C are cross-sectional views showing process steps up to a process step of forming an n⁻layer having an LDD structure in a process for fabricating a semiconductor device according to a third embodiment of the present invention.
Figure 5B:
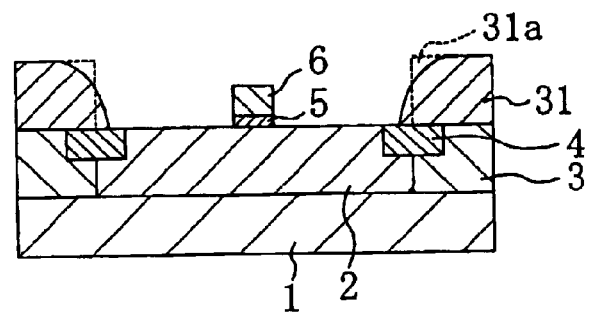
Figure 5C:
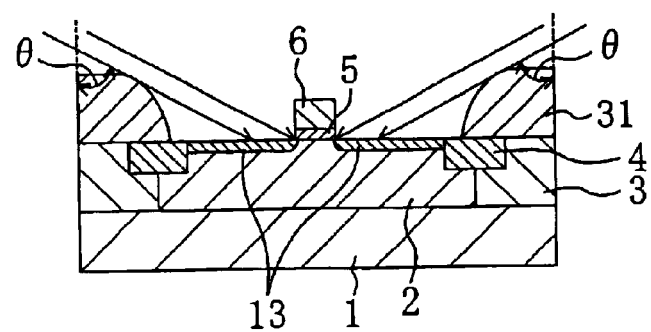

FIGS. 5A through 5C are cross-sectional views showing process steps up to a process step of forming an n⁻layer having an LDD structure in a process for fabricating a semiconductor device according to the third embodiment.

First, in a process step shown in FIG. 5A, a p-type region 2 with a width of 0.5 µm, an n-type region 3 and an insulating film 4 for transistor isolation are defined in an upper part of a silicon substrate 1 in the same manner as in the first embodiment. Then, a gate insulating film 5 with a thickness of 5 nm and a gate electrode 6 with a gate length of 0.15 µm and a thickness of 0.2 µm are formed over the p-type region 2. Thereafter, a hard mask 31a having an opening on the p-type region 2 defined in the silicon substrate 1 is formed to cover the n-type region 3 and part of the insulating film 4. In this embodiment, the hard mask 31a has the same pattern as in the first embodiment and a silicon oxide film: (not shown) with a thickness of about 20 nm underlies the hard mask 31a.

Next, in a process step shown in FIG. 5B, heat treatment is performed at a high temperature of about 800° C. to deform the hard mask 31a to have a tapered edge, thereby forming an implantation hard mask 31.

Then, in a process step shown in FIG. 5C, large-angle-tilt ion implantation of an n-type impurity is performed at an implantation angle of 20 to 60 degrees with respect to the normal to the substrate using the implantation hard mask 31 as a mask, thereby forming an n⁻layer 13 to a depth of 0.1 µm at an impurity concentration of $1 \times 10^{18}/cm^3$. This large-angle-tilt ion implantation is performed with the silicon substrate 1 tilted and rotated. Thereafter, an n⁺ layer (not shown) having an impurity concentration higher than the n⁻layer 13 is formed in a well known manner and is subjected to selective etching, thereby removing the implantation hard mask 31. In this manner, a transistor having an LDD structure is formed.

Figure 6:
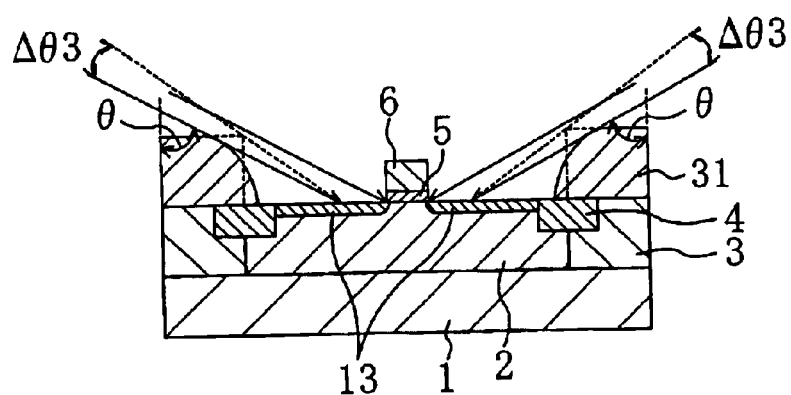
FIG. 6 is a cross-sectional view for describing an ion implantation technique for forming an n⁻ layer 13 in the third embodiment, for comparison to the ion implantation technique in the first embodiment

Now, advantages obtained in this embodiment are described with reference to FIG. 6. FIG. 6 is a cross-sectional view for describing an ion implantation technique for forming the n⁻layer 13 for comparison to the ion implantation technique in the first embodiment.

In this embodiment, the implantation hard mask 31 has the same pattern as in the first embodiment. Accordingly, as in the first embodiment, the implantation mask can be made thinner than in the known technique, so that the aspect ratio can be reduced.

In addition, as shown in FIG. 6, the edge of the implantation hard mask 31 is rounded off by heat treatment, so that the direction of ion implantation can be made closer to the horizontal direction than in the first embodiment by an angle of Δθ3. As a result, ions can be implanted into a wider region.

Embodiment 4

In a fourth embodiment of the present invention, the case where a resist layer whose upper portion is silylated is used as a mask for ion implantation is described.

FIGS. 7A through 7F are cross-sectional views showing process steps up to a process step of forming an n⁻layer having an LDD structure in a process for fabricating a semiconductor device according to the fourth embodiment.

Figure 7A:
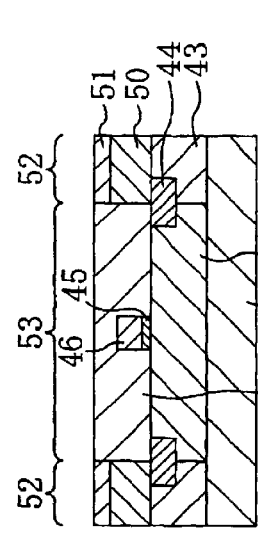
FIGS. 7A through 7F are cross-sectional views showing process steps up to a process step of forming an n⁻layer having an LDD structure in a process for fabricating a semiconductor device according to a fourth embodiment of the present invention.

First, in a process step shown in FIG. 7A, a p-type region 42 with a width of 0.5 µm, an n-type region 43 located at a side of the p-type region 42, and an insulating film 44 for transistor isolation interposed between the p-type region 42 and the n-type region 43 are defined in an upper part of a silicon substrate 41. Then, a gate insulating film 45 with a thickness of 5 nm and a gate electrode 46 with a gate length of 0.15 µm and a thickness of 0.2 µm are formed over the p-type region 42.

Figure 7B:
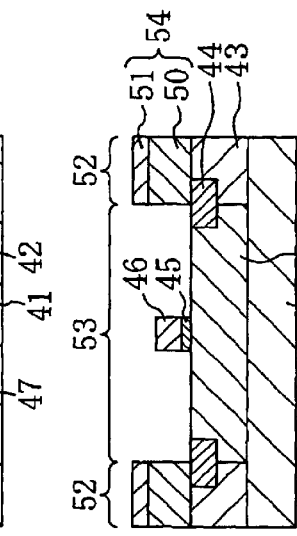

Next, in a process step shown in FIG. 7B, a resist layer 47 is applied onto the substrate to a thickness of 0.6 µm to cover the gate electrode 46.

Figure 7C:
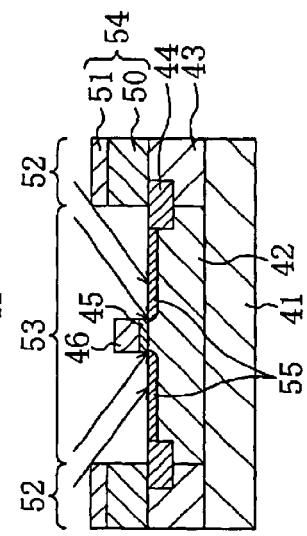

Thereafter, in a process step shown in FIG. 7C, the substrate is exposed to exposure light rays 49, such as ultraviolet rays, with the top of the p-type region 42 shielded by a photomask 48. In this manner, a latent image 50 is created in a region of the resist layer 47 covering the n-type region 43 and part of the insulating film 44.

Figure 7D:
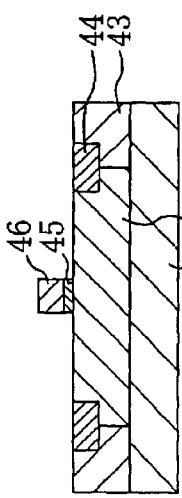

Then, in a process step shown in FIG. 7D, the substrate is brought into contact with a silylation reagent. In this way, a sililated layer 51 is formed to a thickness of 0.1 µm in an upper part of an exposed region 52 (i.e., the latent image 50) defined in the resist layer 47.

Now, the reason why the silylation proceeds selectively in the exposed region 52 is discussed. It is considered that when the resist layer 47 is exposed to the exposure light rays 49, the exposed region 52 readily changes into a porous state, whereas the unexposed region 53 less readily changes into a porous state. Accordingly, the silylation reagent is readily diffused into the exposed region 52, whereas the silylation reagent is less readily diffused into the unexposed region 53. When the substrate is brought into contact with the silylation reagent in these states, sililation is considered to proceed selectively in the upper part of the exposed region 52 in the resist layer 47.

Thereafter, heat treatment is performed at a temperature of about 90° C., thereby oxidizing silicon contained in the silylated layer 51. This oxidation improves the durability of the silylated layer 51 against etching.

Figure 7E:
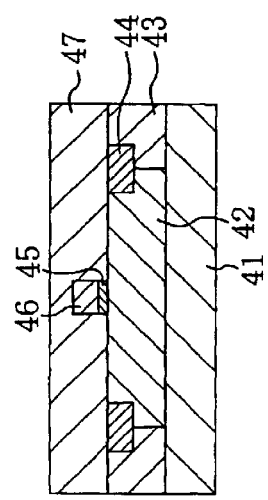

Then, in a process step shown in FIG. 7E, the unexposed region 53 in the resist layer 47 is selectively removed by, for example, RIE using oxygen plasma. In this way, a silylated resist pattern 54 made of the sililated layer 51 and part of the resist layer 47 in which the latent image 50 has been created is formed on the n-type region 43 in the silicon substrate 41. At this time, the upper surface of the p-type region 42 in the silicon substrate 41 is exposed.

Figure 7F:
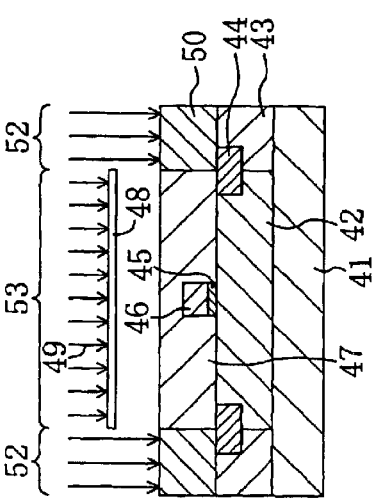

Subsequently, in a process step shown in FIG. 7F, large-angle-tilt ion implantation of an n-type impurity is performed using the silylated resist pattern 54 as a mask, thereby forming an n⁻layer 55 to a depth of 0 µm. This large-angle-tilt implantation is performed by implanting the n-type impurity with the silicon substrate 41 tilted and rotated. Thereafter, an n⁺layer (not shown) having an impurity concentration higher than the n⁻layer 55 is formed in a well known manner, thus forming a transistor having an LDD structure.

Figure 8:
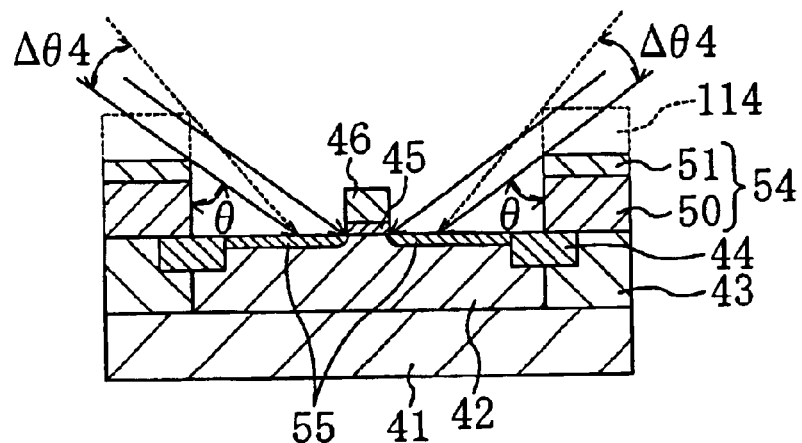
FIG. 8 is a cross-sectional view for describing an ion implantation technique for forming an n⁻layer 55 for comparison to the known ion implantation technique.
Figure 9:
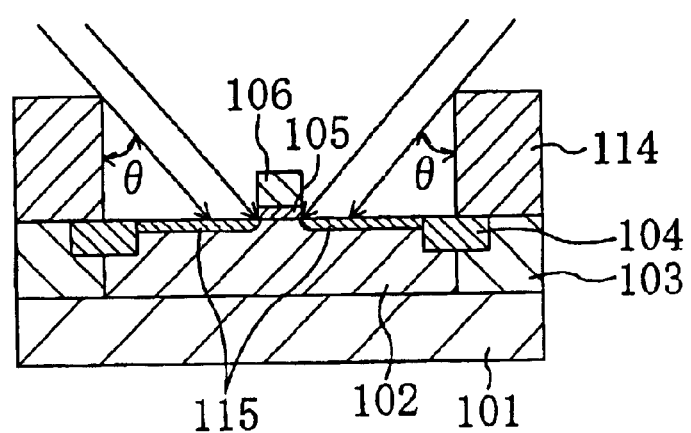
FIG. 9 is a cross-sectional view showing a process step of performing large-angle-tilt ion implantation in a process for fabricating a known semiconductor device.

Now, advantages obtained in this embodiment are described with reference to FIG. 8. FIG. 8 is a cross-sectional view for describing an ion implantation technique for forming the n⁻layer 55 for comparison to the known ion implantation technique.

As shown in FIG. 8, the silylated resist pattern 54 of this embodiment can be made thin as compared to the conventional photoresist layer 114, so that the aspect ratio can be reduced. This is because the silylated resist pattern 54 of this embodiment has a higher ability of preventing impurity implantation into the substrate than the conventional photoresist layer 114.

In this manner, the direction of ion implantation in this embodiment can be set closer to the horizontal direction than in the known ion implantation technique by an angle of Δθ4. As a result, ions can be implanted into a wider region with a shallower junction depth according to this embodiment. In addition, the impurity can be implanted into part of the p-type region 42 located under the gate electrode 46 with higher accuracy.

In addition, the negative-type resist is used in this embodiment. Alternatively, a positive-type resist may be used in the present invention. In such a case, the unexposed region is selectively silylated.

Other Embodiments

In the foregoing embodiments, the present invention is applied to the process step of forming an n⁻layer having an LDD structure. Alternatively, the present invention is applicable to processes such as well implantation, pocket implantation, or ion implantation in a process for fabricating a device with asymmetric doped regions. In such a case, the same advantages can be obtained.

In the first through third embodiments, the BPSG film is used as an implantation hard mask. Alternatively, the silylated resist layer may be used as an implantation hard mask according to the present invention. In such a case, the edge of the silylated resist layer can be rounded off by plasma etching using oxygen.

In the first through third embodiments, the BPSG film is used as an implantation hard mask. Alternatively, a PSG. (phospho-silicate glass) film or a nitride film may be used as an implantation mask according to the present invention.

In the foregoing embodiments, description is made using the silicon substrate. However, the present invention is also applicable to an SOI substrate.

As has been described above, according to the present invention, a BPSG film; or a silylated resist layer having a shorter ion implantation range than the conventional photoresist is used as a mask for ion implantation, so that the mask for ion implantation can be made thin as compared to the known ion implantation technique. Accordingly, the direction of ion implantation can be set closer to the horizontal direction than in the known ion implantation technique, resulting in that ions can be implanted into a wider region with a shallower junction depth.

In addition, the edge of the mask for ion implantation can be rounded off, so that the region in which implantation of the impurity is prevented by the mask for ion implantation can be reduced. As a result, the resultant semiconductor device can be downsized.

What is claimed is:

1. A method for fabricating a semiconductor device, the method comprising the steps of:

a) forming a gate insulating film and a gate electrode over a first transistor region defined in a semiconductor substrate;

b) forming, on the semiconductor substrate, a hard mask having an opening for exposing the first transistor region therein, after the step a) has been performed;

c) implanting an impurity into the semiconductor substrate in the manner of large-angle-tilt ion implantation, using the gate electrode and the hard mask as a mask for ion implantation; and d) removing the hard mask, after the step c) has been performed, wherein a second transistor region is provided at a side of the first transistor region in part of the semiconductor substrate with an insulating film for transistor isolation interposed therebetween, and in the step b), the hard mask is formed to cover the second transistor region.

2. The method of claim 1, wherein in the step b), the thickness of the hard mask and the width of the opening of the hard mask are defined such that the impurity reaches a region under the gate electrode during the large-angle-tilt ion implantation in the step c).

3. The method of claim 1, wherein the hard mask is one out of a BPSG film, a PSG film and a silicon nitride film.

4. A method for fabricating a semiconductor device, the method comprising the steps of:

a) forming a gate insulating film and a gate electrode over a first transistor region defined in a semiconductor substrate;

b) forming, on the semiconductor substrate, a hard mask having an opening for exposing the first transistor region therein, after the step a) has been performed;

c) implanting an impurity into the semiconductor substrate in the manner of large-angle-tilt ion implantation, using the gate electrode and the hard mask as a mask for ion implantation;

d) removing the hard mask after the step c) has been performed; and e) rounding off an upper edge of the hard mask, thereby making the hard mask to have a tapered edge, between the steps b) and c).

5. The method of claim 4, wherein in the step e), isotropic etching is performed, thereby making the hard mask to have the tapered edge.

6. The method of claim 4, wherein in the step e), heat treatment is performed, thereby making the hard mask to have the tapered edge.

7. A method for fabricating a semiconductor device, the method comprising the steps of:

a) forming a gate insulating film and a gate electrode over a first transistor region defined in a semiconductor substrate;

b) forming a resist layer on the semiconductor substrate;

c) silylating at least part of the resist layer other than a region of the resist layer located on the first transistor region, thereby forming a silylated region;

d) removing at least part of the region of the resist layer other than the silylated region, thereby forming a silylated resist pattern; and e) implanting an impurity into the semiconductor substrate in the manner of large-angle-tilt ion implantation, using the silylated resist pattern as a mask for ion implantation.

8. The method of claim 7, including the step of oxidizing the silylated region, between the steps d) and e).

9. The method of claim 4, wherein the hard mask is one of a BPSG film, a PSG film and a silicon nitride film.

* * * * *